US007960037B2

(12) United States Patent
Liu et al.

(10) Patent No.: US 7,960,037 B2
(45) Date of Patent: Jun. 14, 2011

(54) CARBON NANOTUBE POLYMER COMPOSITION AND DEVICES

(75) Inventors: Gao Liu, Oakland, CA (US); Stephen Johnson, Richmond, CA (US); John B. Kerr, Oakland, CA (US); Andrew M. Minor, El Cerrito, CA (US); Samuel S. Mao, Castro Valley, CA (US)

(73) Assignee: The Regents of the University of California, Oakland, CA (US)

( * ) Notice: Subject to any disclaimer, the term of this patent is extended or adjusted under 35 U.S.C. 154(b) by 939 days.

(21) Appl. No.: 11/293,681

(22) Filed: Dec. 2, 2005

(65) Prior Publication Data
US 2006/0118768 A1 Jun. 8, 2006

Related U.S. Application Data

(60) Provisional application No. 60/634,175, filed on Dec. 3, 2004.

(51) Int. Cl.
*H01L 51/54* (2006.01)
(52) U.S. Cl. ........ 428/690; 428/917; 313/504; 313/506; 252/301.16; 257/40; 257/103; 257/E51.04
(58) Field of Classification Search .................. 428/690, 428/917; 313/504, 506; 257/40, E51.04; 252/500–518.1; 136/263; 524/495, 496
See application file for complete search history.

(56) References Cited

U.S. PATENT DOCUMENTS

| | | | | |
|---|---|---|---|---|
| 4,880,508 A * | 11/1989 | Aldissi | ............................ | 205/419 |
| 5,449,564 A * | 9/1995 | Nishio et al. | .................... | 428/690 |
| 5,900,327 A * | 5/1999 | Pei et al. | ........................ | 428/690 |
| 6,309,763 B1 | 10/2001 | Woo et al. | | |
| 6,512,083 B1 | 1/2003 | Woo et al. | | |
| 6,605,373 B2 | 8/2003 | Woo et al. | | |
| 2002/0004028 A1 | 1/2002 | Margrave et al. | | |
| 2002/0046872 A1 | 4/2002 | Smalley et al. | | |
| 2002/0048632 A1 | 4/2002 | Smalley et al. | | |
| 2002/0068170 A1 | 6/2002 | Smalley et al. | | |
| 2002/0193551 A1 | 12/2002 | Pei | | |
| 2003/0001141 A1* | 1/2003 | Sun et al. | .................. | 252/301.35 |
| 2003/0013843 A1 | 1/2003 | Pei | | |
| 2003/0208032 A1 | 11/2003 | Woo et al. | | |
| 2004/0038251 A1 | 2/2004 | Smalley et al. | | |
| 2004/0040834 A1 | 3/2004 | Smalley et al. | | |
| 2004/0118448 A1* | 6/2004 | Scher et al. | .................... | 136/252 |
| 2005/0227108 A1* | 10/2005 | Lewis et al. | .................... | 428/690 |

FOREIGN PATENT DOCUMENTS

JP 2002/205087 A * 10/2002

OTHER PUBLICATIONS

Machine translation of JP 2002/305087 A (2002).*
Antonov, R. D. et al., "Subband Population in a Single-Wall Carbon Nanotube Diode," Physical Review Letters, vol. 83 (No. 16), p. 3274-76, (Oct. 18, 1999).
Bahr, J. et al., "Dissolution of Small Diameter Single-Wall Carbon Nanotubes in Organic Sovents?," Chem Communications, p. 193-194, (Dec. 1, 2001).
Braun, D. et al., "Visible Light Emission from Semiconducting Polymer Diodes," Applied Physics Lett., vol. 58 (No. 18), p. 1982-1984, (May 6, 1991).
Burroughes, J. H. et al., "Light-Emitting Diodes Based on Conjugated Polymers," Nature, p. 539-541, (Oct. 11, 1990).
Chen, J. et al., "Dissolution of Full-Length Single-Walled Carbon Nanotubes," J. Phys. Chem B, Amer Chem Society, vol. 105 (No. 13), p. 2525-2528, (Mar. 10, 2001).
Chiang, I. W. et al, "Purification and Characterization of Single-Wall Carbon Nanotubes," J. Phys. Chem B, Amer Chem Society, vol. 105 (No. 6), p. 1157-1161, (Jan. 12, 2001).
Dalton, A. B. et al., "A Functional Conjugated Polymer to Process, Purify and Selectively Interact with Single Wall Carbon Nanotubes," Synthetic Metals, Elsevier, p. 1217-1218, (2001).
Fournet, P. et al., "A Carbon Nanotube Composite as an Electron Transport Layer for M3EH-PPV Based Light-Emitting Diodes," Synthetic Metals, Elsevier, p. 1683-1684, (2001).
Fournet, P. et al., "Enhanced Brightness in Organic Light-Emitting Diodes Using a Carbon Nanotube Composite as an Electron-Transport Layer," Journal of Applied Physics, vol. 90 (No. 2), p. 969-975, (Jul. 15, 2001).
Hebner, T. R. et al., "Inkjet Printing of Doped Polymers for Light Emitting Devices," Applied Physics Letters, vol. 72 (No. 8), p. 519-521, (Feb. 2, 1998).
Martel, R. et al., "Single-and Multi-Wall Carbon Nanotube Field-Effect Transistors," Applied Physics Letters, vol. 73 (No. 17), p. 2447-2449, (Oct. 26, 1998).
Mc Carthy, B. et al., "Microscopy Studies of Nanotube-Conjugated Polymer Interactions," Synthetic Metals, Elsevier, p. 1225-1226, (2001).
Moses, M. J. et al., "Interpenetrating As20 Fullerene and Ni12 Icosahedra in the Onion-Skin [As@Ni12@As20]3-Ion," Science, p. 778, (May 2, 2003).
Nguyen, T.Q. et al., "Conjugated Polymer Aggregates in Solution: Control of Interchain Interactions," Journal of Chemical Physics, vol. 110 (No. 8), p. 4068-4078, (Feb. 22, 1999).
O'Connell, M. J. et al, "Band Gap Fluorescence from Individual Single-Walled Carbon Nanotubes," Science, p. 593-596, (Jul. 26, 2002).
O'Connell, M. J. et al, "Reversible Water-Solubilization of Single-Wallled Carbon Nanotubes by Polymer Wrapping," Chemistry Physics Letters, p. 265-271, (Jul. 13, 2001).
Pardo, D. A. et al., "Application of Screen Printing in the Fabrication of Organic Light-Emitting Devices," Advanced Materials, vol. 12 (No. 17), p. 1249-1252, (Sep. 1, 2000).
Richard, C. et al., "Supramolecular Self-Assembly of Lipid Derivatives on Carbon Nanotubes," Science, p. 775-777, (May 2, 2003).
Snow, E.S. et al., "Random Networks of Carbon Nanotubes as an Electronic Material," Applied Physics Letters, vol. 82 (No. 13), p. 2145-2147, (Mar. 31, 2003).

(Continued)

Primary Examiner — D. Lawremce Tarazano
Assistant Examiner — Michael H Wilson
(74) Attorney, Agent, or Firm — Robin C. Chiang; Lawrence Berkeley National Laboratory (57) ABSTRACT

A thin film device and compound having an anode, a cathode, and at least one light emitting layer between the anode and cathode, the at least one light emitting layer having at least one carbon nanotube and a conductive polymer.

13 Claims, 6 Drawing Sheets

OTHER PUBLICATIONS

Stephan, O. et al., "Blue Light Electroluminescent Devices Based on a Coplymer Derived from Fluorene and Carbozole," Synthetic Metals, Elsevier, vol. 106 (No. 2), p. 115-119, (1999).

Tang, C. W. et al., "Organic Electroluminescent Diodes," Applied Physics Letters, vol. 51 (No. 12), p. 913-915, (Sep. 21, 1997).

Woo, H. S. et al., "Hole Blocking in Carbon Nanotube-Polymer Composite Organic Light-Emitting Diodes Based on Poly (m-phenylene vinylene-co-2, 5-dioctoxy-p-phenylene vinylene)," Applied Physics Letters, vol. 77 (No. 9), p. 1393-1395, (Aug. 28, 2000).

Woo, H. S. et al., "Organic Light Emitting Diodes Fabricated with Single Wall Carbon Nanotubes Dispersed in a Hole Conducting Buffer: The Role of Carbon Nanotubes in a Hole Conducting Polymer," Synthetic Metals, Elsevier, p. 369-372, (2001).

Xia, H.S. et al., "Polymer-Encapsulated Carbon Nanotubes Prepared Through Ultrasonically Initiated In Situ Emulsion Polymerization," Chemistry of Materials, vol. 15 (No. 20), p. 3879-3886, (Sep. 5, 2003).

Yang, M. et al., "Journal of Materials Science," Organic Light Emitting Diodes Based on Multi-Wall Carbon Nanotubes {MWNTs} Modified Electrode, p. 3777-3778, (2004).

G. Liu, S. Johnson, and J.B. Kerr, "Solvent Processible Composite Carbon Nanotube Cathode for Polymer LED Applications", oral presentation on Dec. 3, 2003 (the MRS 2003 Fall Meeting schedule is attached).

G. Liu, S. Johnson, and J.B. Kerr, "Solvent Processible Composite Carbon Nanotube Cathode for Polymer LED Applications", Mat. Res. Soc. Symp. Proc., vol. 796, pp. V6.8.1-V6.8.6 (2004).

G. Liu, S. Johnson, S.S. Mao, and J.B. Kerr, "Morphological control of an amphiphilic polyfluorene and the effects on device performance", 2004 Joint Intl. Meeting—13th Intl. Symp. Phys. Chem. Lumin. Mat., oral presentation on Oct. 6, 2004 (the meeting schedule is attached).

* cited by examiner

CARBON NANOTUBE POLYMER COMPOSITION AND DEVICES

CROSS-REFERENCE TO RELATED APPLICATIONS

This application claims priority to provisional application Ser. No. 60/634,175 entitled, "Carbon Nanotube Polymer Composition And Devices" filed on Dec. 3, 2004 and is hereby incorporated by reference.

STATEMENT OF GOVERNMENTAL SUPPORT

This invention was made with government support under Contract DE-AC02-05CH11231 awarded by the United States Department of Energy to The Regents of the University of California for the management and operation of the Lawrence Berkeley National Laboratory. The government has certain rights in this invention.

FIELD OF THE INVENTION

The present invention relates to thin film devices. More particularly, the present invention relates to thin film composition and devices such as organic light emitting devices ("OLEDs") and organic photovoltaic devices.

BACKGROUND OF THE INVENTION

Efficient thin film devices, including organic photovoltaic and organic electroluminescent devices have been the subject of much advancement recently. In particular, organic light emitting materials have attracted increasing interest in the past two decades.[1] OLEDs may be either small molecule OLED or polymer OLED. Soluble light emitting polymers are appealing for manufacture of large area, low cost light emitting devices.[2] In recent years, screen and inkjet printing have been successfully applied to this area, promising lower cost for area lighting, patterning and display applications.[3] While the emissive electroluminescent layer is polymeric, varying amounts of OLEDs can be deposited in arrays on a screen using simple "printing" methods to create a graphical color display, for use as television screens, computer displays, advertising and information board applications, and the like. OLED may also be used in lighting devices. Prior to standardization, OLED technology was also referred to as organic electro-luminescence.

In order to achieve low cost and high efficiency, it is crucial to have an air stable cathode with efficient electron injection properties. Currently, OLEDs are processed using a cathode that is very sensitive to oxygen and water. The electron injection for the polymer device is achieved by using a low work function metal such as calcium or magnesium, which are very reactive to oxygen and moisture and become poor conductors due to its oxidation. Consequently, the manufacturing of these devices requires processing under vacuum while applying the cathode and subsequent application of an air impermeable encapsulation to ensure life of the product. There are also silver paint based polymer light emitted diode devices, however, those devices are used in electrochemical cells rather than OLEDs. Additionally, the use of metals such as calcium, magnesium, or silver blocks useable light from the cathode since they are not transparent and trap the light emissions within the polymer device.

Single wall carbon nanotubes (SVVNT) have been demonstrated to be viable as electron injection material for application in OLEDs.[4] However, the applications are limited by the available materials to render the SWNT soluble as well as its compatibility to the light emitting materials. SWNTs commonly aggregate in solution which may render them unusable since it is not possible to form a uniform layer of the SWNTs on the cathode and/or many SWNT aggregates must be used in order to be a good conductor. Thus, surfactants are used to grab the nanotubes and disperse them. Unfortunately, poly (m-phenylene-vinylene-co-2,5-dioctyloxy-p-phenylene-vinylene) (PmPV) is so far the only conducting polymer which has been found to be able to wrap around the SWNT to stabilize the tubes in solution phase.[5] Low solubility of SWNT in other conductive polymer systems is one of the major obstacles for wide range applications.

Other viable materials found to solubilize/suspend SWNT in water solution is polyvinyl pyrrolidone (PVP) and polystyrene sulfonate (PSS). Small molecule amphiphiles (surfactants) have also been used to solublize/suspend SWNT in aqueous solutions.

The established methods of dissolving carbon nanotubes are either using surfactants or polymer wrapping agents.[6] Those molecules are able to associate on the nanotube surface. The carbon nanotube concentrations are typically 0.1-0.01% (by weight) in these surfactant stabilized systems. In situ polymerization of the surfactant in the solution system can provide a permanent coating on the nanotube. Therefore, development of other conductive polymer surfactants to disperse the SWNTs and non-metal based OLEDs that are processed with air stable cathode composite materials with good electron injection properties is a key step for lowering the overall cost of OLEDs.

BRIEF DESCRIPTION OF THE INVENTION

A thin film device and compound having an anode, a cathode, and at least one light emitting layer between the anode and cathode, the at least one light emitting layer having at least one carbon nanotube and a conductive polymer.

BRIEF DESCRIPTION OF THE DRAWINGS

The accompanying drawings, which are incorporated into and constitute a part of this specification, illustrate one or more embodiments and, together with the detailed description, serve to explain the principles and implementations of the invention.

DETAILED DESCRIPTION

Embodiments are described herein in the context of a carbon nanotube polymer composition and devices. Those of ordinary skill in the art will realize that the following detailed description of the present invention is illustrative only and is not intended to be in any way limiting. Other embodiments will readily suggest themselves to such skilled persons having the benefit of this disclosure. Reference will now be made in detail to implementations as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Definitions:

"Oligo" means between 2-25 repeating units.

"Carbon nanotube" as used herein is meant to include single wall and multi-wall carbon nanotubes unless specifically specified as distinct. Any size and diameter is contemplated as useful for the invention. This includes n-type and p-type and metallic nanotubes, non-cylindrical nanotubes, and mixtures of carbon and other atoms.

"Tetraamine" means that the N is bonded to four other atoms, which would give it a positive charge.

The nanotubes used herein may be n-type or p-type for the purpose of balancing the charge transfer in the conductive polymer matrix. One having ordinary skill in the art will appreciate how to optimize this parameter.

The carbon nanotubes may be associated with the conductive polymer such that the side chains will wrap around the nanotube and bond by Van der Waal forces.

The OLEDs may use a mixture of polymers and/or carbon nanotubes in either the light emitting layer, the hole transport layer, electron transport layer, anode, and/or cathode.

The length of the polymer backbone in the present invention, n, can vary between 2 and 1000. Any length depending on the desired use is suitable and not intended to be limiting. n may be between about 2-500, 50-300 and 100-200.

The invention provides for a stable and conductive polymer composite material able to disperse nanotubes. The conductive polymer may be a compound having the following structure:

$R_1$ and $R_2$ may be an oligoether group, an alkyl chain having a tetaryamine and an associated counter ion, or an alkyl chain having an $SO_3$ group and an associated counter ion. The oligoether group may terminate with a methyl group or hydroxyl group and may be methyleneoxide, ethyleneoxide, trimethyleneoxide, or tetramethyleneoxide. n may be between 2 and 1000.

The alkyl chain having a tetaryamine and an associated counter ion and the alkyl chain having an $SO_3$ group and an associated counter ion may comprise 2-20 carbon atoms. $R_1$ and $R_2$ may each further comprise methyltriethyleneoxide. $R_1$ and $R_2$ may be independently the same group or a different group.

Figure 1A:
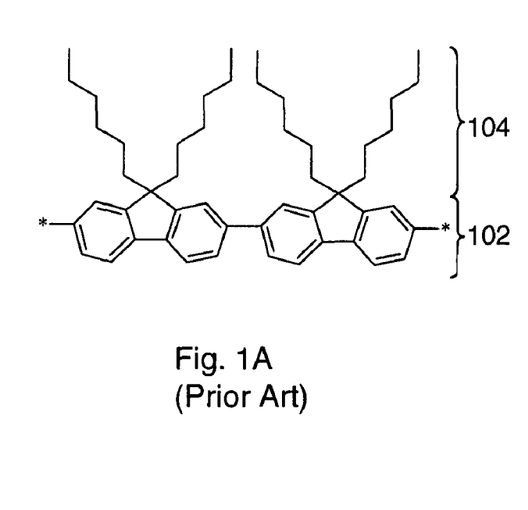
FIGS. 1A and 1B illustrate the structure of poly(9,9"-dihexylfluorene) ("PF") and poly[2,7-(9,9-bis(3,6,9-trioxadecyl)fluorene)] ("PFO"), respectively
Figure 1B:
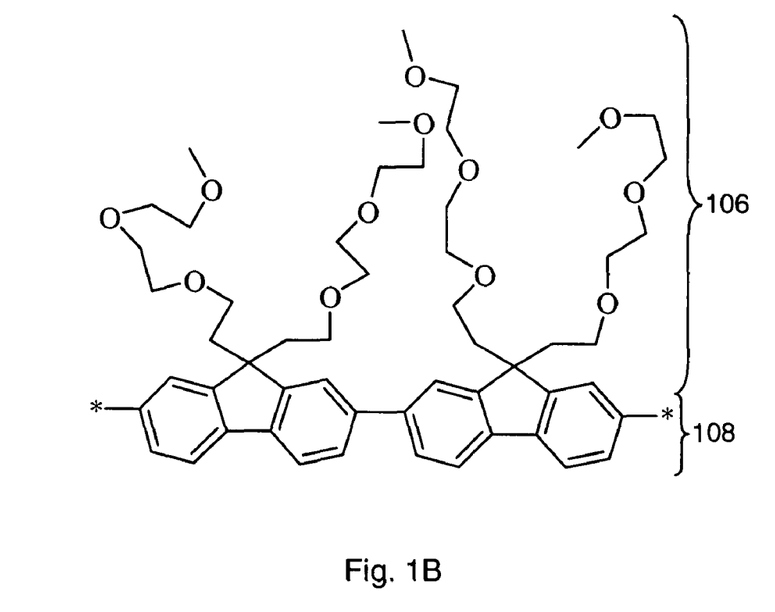

FIGS. 1A and 1B illustrate the structure of poly(9,9"-dihexylfluorene) ("PF") and poly[2,7-(9,9-bis(3,6,9-trioxadecyl)fluorene)] ("PFO"), respectively. PF may be used to disperse carbon nanotubes, but is not as effective as PFO. As illustrated in FIG. 1A, PF has a rigid backbone 102 and flexible side chains 104. PF is not effective since it does not possess surfactant properties and the backbone 102 and side chains 104 are both hydrophobic and non-polar and are not able to efficiently grab and disperse the carbon nanotubes, as will be described in detail below.

FIG. 1B illustrates the structure of PFO which effectively grabs and disperses the carbon nanotubes since it possesses surfactant properties and is able to stabilize the carbon nanotube dispersions in organic solutions at useful concentrations. Furthermore, PFO is a conductive polymer. PFO contains a non-polar, rigid backbone 108 and polar flexible side chains 106 whereby the carbon nanotube is grasped by the polar side chains 106.

To illustrate the effects of PF and PFO on the solubility of carbon nanotube dispersions, tests were conducted with carbon nanotubes dispersed in chloroform (CF) or chlorobenzene (CB) solution with PF or PFO as stabilization agents in the following solutions:

Solution (a). dispersion of carbon nanotube in PF and CB
Solution (b). dispersion of carbon nanotube in PF and CF
Solution (c). dispersion of carbon nanotube in PFO and CB
Solution (d). dispersion of carbon nanotube in PFO and CF After sedimentation, the mixtures were sonically agitated for one hour at room temperature and left without disturbance for one week. Scanning electron microscopy ("SEM") images of solution cast film were taken which confirmed the optical results and showed the following:

Solutions (a) and (b)

The carbon nanotube precipitated out of the CF and CB solutions with alkyl side chain PF polymers as the stabilization agent. Alkyl moieties and the polyfluorene backbone are both non-polar; therefore the PF could not provide any stabilization effects toward the carbon nanotube in solution phase. The carbon nanotubes initially dispersed during sonic agitation, but aggregated and precipitated after left standing for a period of time. Thus, solutions (a) and (b) had an upper clear layer section. SEM images confirmed the absence of the carbon nanotube in the upper clear layer solutions. No aggregate was observed under 400× optical microscopy with PFO as the stabilization agent.

Solution (c)

The carbon nanotube does not precipitate out of the CB solution with ethyleneoxide side chain PFO polymers as the stabilization agent. SEM images confirmed that carbon nanotubes were abundant in the upper layer CB solutions and were separated. It was observed that the carbon nanotube was not distributed as individual tubes but instead aggregated in ropes. However, the aggregate size was very uniform which could be further distributed by using higher sonication power. The PFO/CB solution was able to suspend and stabilize 0.02% (weight) of carbon nanotubes in the solution phase. This is 2% (weight) of the carbon nanotube to the PFO polymer.

Solution (d)

The carbon nanotube partially precipitated out of the CF solution with ethyleneoxide side chain PFO polymers as the stabilization agent. The PFO/CF solution was also able to suspend and stabilize the carbon nanotube but in a far lesser extent. No aggregate was observed in solution phase under 400× optical microscopy in with PFO as the stabilization agent.

Use of PFO as a polymer to disperse the carbon nanotubes allows for the production of highly conductive and transparent cathodes as further described below. The transparency provides for a greater light extraction since the light emissions are not kept within the polymer device and the ability to see through the cathode provides many commercial advantages. The PFO polymer interaction with the carbon nanotube is responsible for the stability of the carbon nanotube. The polymer wrapping structure can be derived from the different solubility behaviors of carbon nanotube in CB and CF solutions.

As described above, the results indicate that the polar side chains and non-polar backbone of PFO will aggregate differently in different solvents. CF and CB are two different types of solvent systems used and described herein, but are for exemplary purposes only and not intended to be exhaustive examples.

Figure 2A:
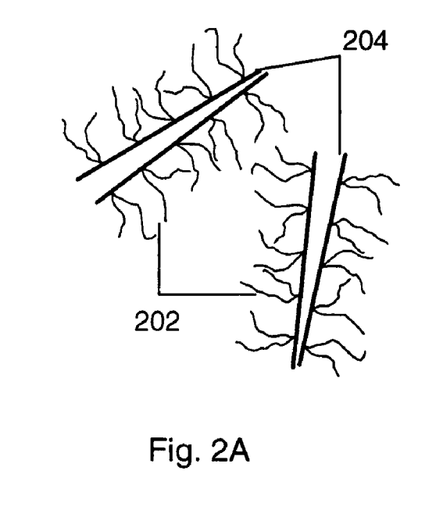
FIGS. 2A-2C illustrate the different aggregation patters of PFO.
Figure 2B:
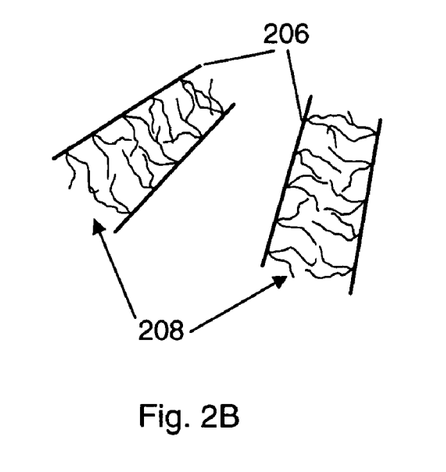
Figure 2C:
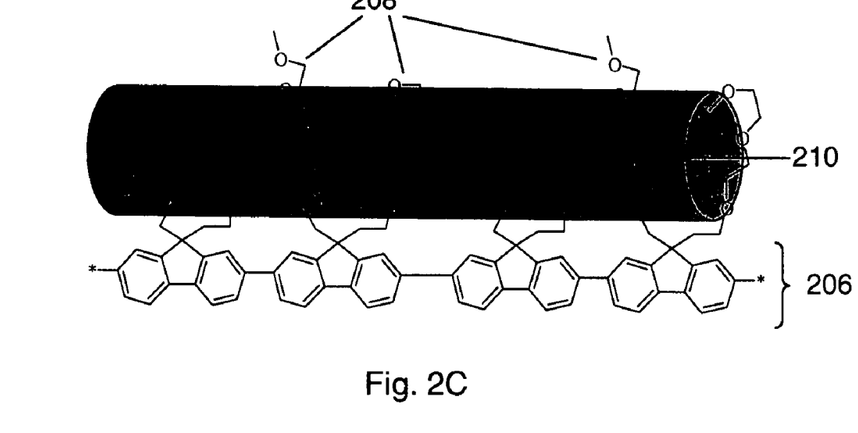

FIGS. 2A-2C illustrate the different aggregation patterns of PFO in different solvent systems. FIG. 2A illustrates the aggregation pattern of PFO in CF. CF is a polar solvent, which selectively solvates the polar side chains 202 and forces the backbone 204 to aggregate. The arrangement with the polar side chain 202 on the outside may limit the extent of the interaction between the polymer and the carbon nanotube.

In contrast, FIG. 2B illustrates the aggregation pattern of PFO in CB. CB is a weak polar aromatic solvent, which prefers to interact with the conjugated polyfluorene backbone 206 through π-π stacking interaction. The side chains 208 are clustered inside the aggregate while the backbones 206 form the outer envelope in the CB solution. This pattern allows for a carbon nanotube to be positioned within the center surrounded by the side chains 208 and between the backbones 206.

FIG. 2C illustrates the carbon nanotube coupled to PFO. The carbon nanotube 210 may reside in the center of the cluster of side chains 208 of FIG. 2B. The nonpolar backbone 206 provides a template while flexible oligoethyleneoxide side chains 208 wrap around the carbon nanotube 210. Therefore, CB/PFO solution with the polar groups on the inside of the aggregate yields the best ability to disperse and stabilize carbon nanotubes.

Figure 3A:
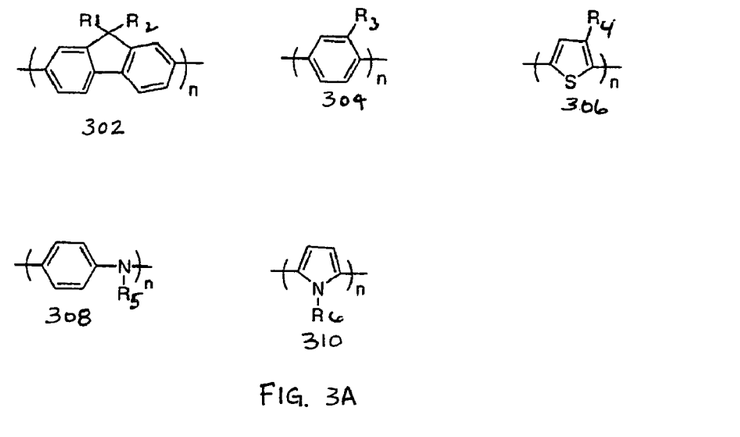
FIGS. 3A-3C illustrate other conductive polymer materials.
Figure 3B:
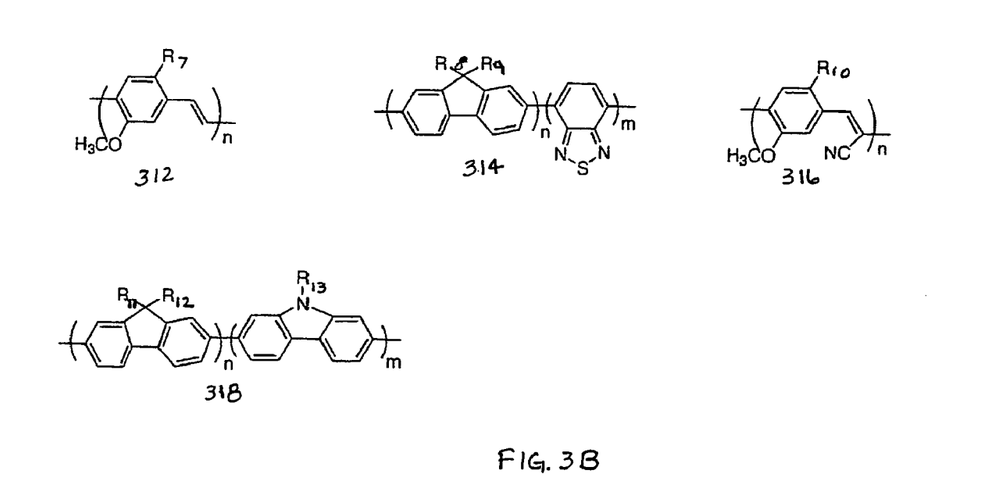
Figure 3C:
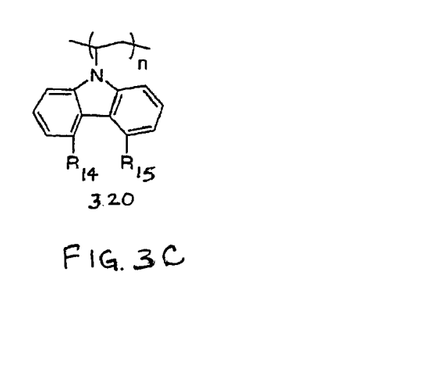

FIGS. 3A-3C illustrate other conductive polymer materials able to disperse carbon nanotubes. The conductive polymer composite material may have the formula:

(X)n where X may be a conjugated homo polymer, a conjugated copolymer, or a linear polymer with conducting conjugated pending group. FIG. 3A illustrates the various possible conjugated homo polymers, which may be polyfluorene 302, polyphenylene 304, polythiophene 306, polyaniline 308, or polypyrrole 310. FIG. 3B illustrates the various possible conjugated copolymers, which may be PPV 312, poly(benzothiadiazole-co-fluorene) 314, poly(phenylenecyanovinylene) 316, or poly(flurorene-co-carbazole) 318. FIG. 3C illustrates a linear polymer, polyvinylcarbazole 320, which may also be used.

$R_1$-$R_{15}$ may be an oligoether group, an alkyl chain having a tetaryamine and an associated counter ion, or an alkyl chain having an $SO_3$ group and an associated counter ion. The oligoether group may terminate with a methyl group or hydroxyl group and may be methyleneoxide, ethyleneoxide, trimethyleneoxide, or tetramethyleneoxide. n may be between 2 and 1000. The alkyl chain having a tetaryamine and an associated counter ion and the alkyl chain having an $SO_3$ group and an associated counter ion may comprise 2-20 carbon atoms. $R_1$-$R_{15}$ may each further comprise methyltriethyleneoxide. $R_1$-$R_{15}$ may be independently the same group or a different group.

Figure 4A:
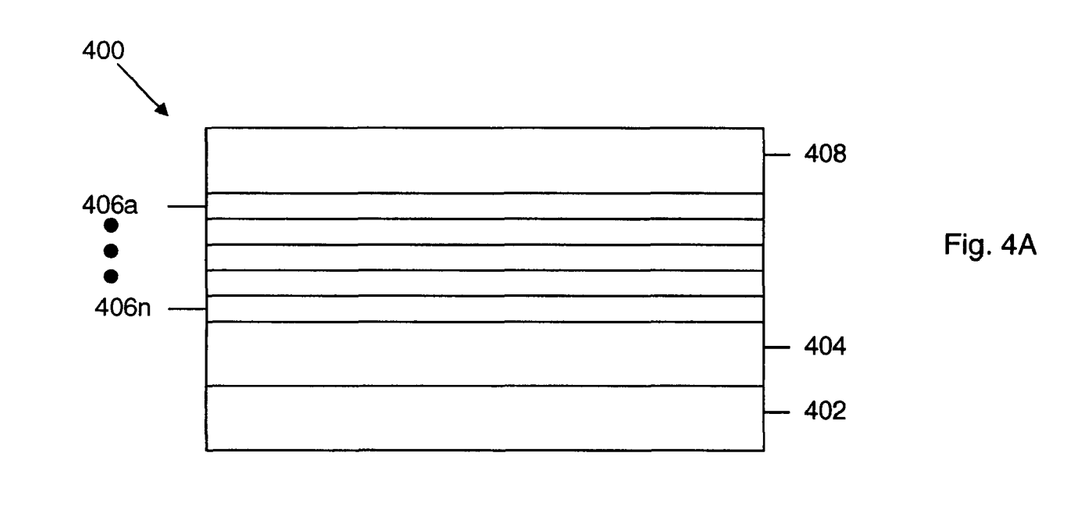
FIGS. 4A and 4B illustrate embodiments of a thin film device.

FIGS. 4A and 4B illustrate embodiments of a thin film device. As illustrated in FIG. 4A, the thin film device, generally numbered 400, may be positioned on a substrate 402, have an anode 404, at least one light emitting polymer layer 406a, 406n (where n is an integer), and a cathode 408. The substrate 402 may be any type of flexible and/or transparent substrate such as glass or plastic and may have a thickness of about 1 mm-3 mm. The anode 404 may be any anode such as an indium-tin-oxide ("ITO") electrode and may have a thickness of about 50 nm-250 nm. The cathode 408 may be any of the polymers described above with reference to FIGS. 1B, 2C, or 3A-3C and may have a thickness of about 10 nm-10,000 nm. Additionally, the anode 404 and cathode 408 may both contain carbon nanotubes dispersed within any of the polymers described above with reference to FIGS. 1B, 2C, or 3A-3C.

Figure 4B:
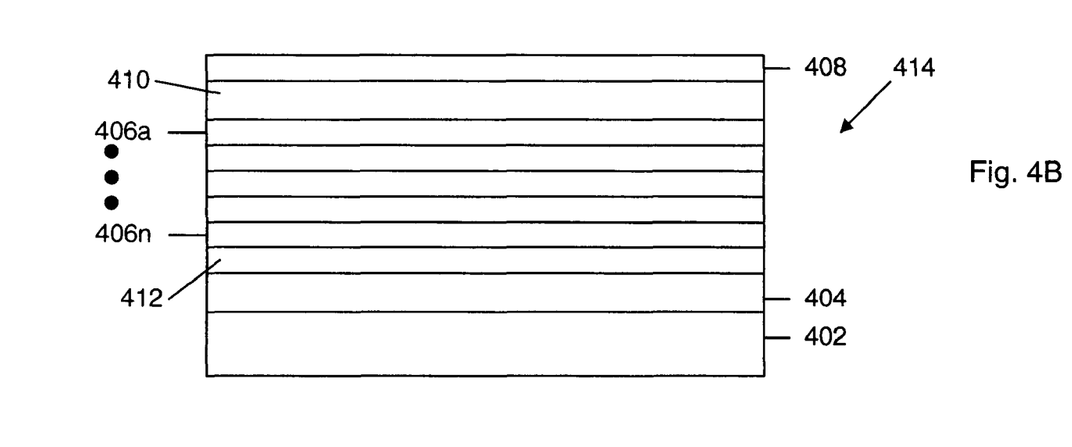

In an alternative embodiment, the thin film device, generally numbered 414 illustrated in FIG. 4B, may have an electron transport layer 410 and/or a hole transport layer 412. However, it will be appreciated that the device may have either the electron transport layer 410 or the hole transport layer 412, neither of the layers, or both of the layers. Carbon nanotubes may also be dispersed within the electron transport layer and/or the hole transport layer.

It is preferable that the excitation of light emissions occur within the light emitting polymer layer 406a, 406n, and not near or on the interface between the anode 404 or cathode 408. Should the excitation of light occur at the interface between either the anode 404 or cathode 408, the device will lose efficiency and give off heat rather than light. Thus, it is beneficial for the excitation of light emissions to occur in the center of the light emitting polymer layer 406a, 406n. It has been determined that the addition of carbon nanotubes in the light emitting polymer layer 406a, 406n allows for the balance of charge injection within the light emitting polymer layer 406a, 406n which decreases and/or eliminates the incidence of excitation of light emissions at the interface between the anode 404 and cathode 408. The polymer used within the light emitting polymer layer 406a, 406n may be any type of polymer commonly used. The light emitting polymer layer 406a, 406n may have a thickness of about 50 nm-10,000 nm.

Additionally, the polymer described above with reference to FIGS. 1B, 2C, or 3A-3C may be used. If used, the light emitting polymer layer 406a, 406n may be positioned on the anode 404 by any means such as spin coating. As such, the light emitting polymer layer 406a, 406n may be applied directly without thermal evaporation or vacuum deposition thereby reducing the costly encapsulation processes and materials.

Figure 5:
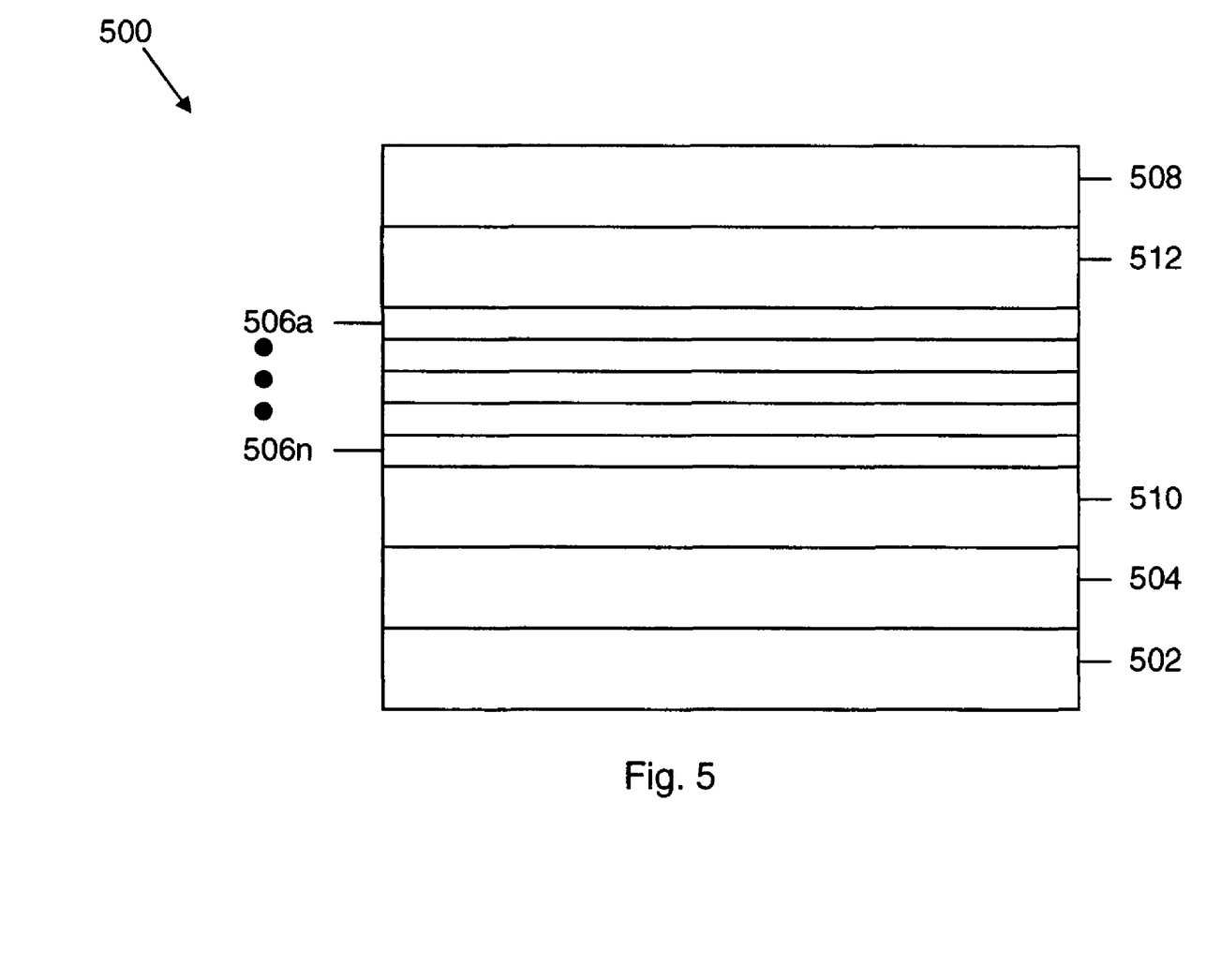
FIG. 5 illustrates a photovoltaic device.

FIG. 5 illustrates a photovoltaic device. The thin film device may be used in OLEDs as well as a photovoltaic device, generally numbered 500, that are capable of generating electricity in response to electromagnetic stimulation. The photovoltaic device 500 may be positioned on a substrate 502, have an anode 504, at least one light harvesting polymer layer 506a, 506n, a cathode 508, and a hole transport layer 510 and/or an electron transport layer 512. The substrate 502 may be any type of flexible and/or transparent substrate such as glass or plastic and may have a thickness of about 1 mm-3 mm. The anode 504 may be any anode such as an indium-tin-oxide ("ITO") electrode and may have a thickness of about 50 nm-250 nm. The cathode 508 may be any of the polymers described above with reference to FIGS. 1B, 2C, or 3A-3C and may have a thickness of about 10 nm-10,000 nm. Additionally, the anode 504 and cathode 508 may both contain carbon nanotubes dispersed within any of the polymers described above with reference to FIGS. 1B, 2C, or 3A-3C.

The light harvesting polymer layer 506a, 506n may contain carbon nanotubes to allow for the rapid charge migration within the light harvesting polymer layer 506a, 506n which increases the photovoltaic efficacy. The polymer used within the light harvesting polymer layer 506a, 506n may be any type of polymer commonly used including the polymer described above with reference to FIGS. 1B, 2C, or 3A-3C. The light harvesting polymer layer 506a, 506n may have a thickness of about 50 nm-10,000 nm.

The hole transport layer 510 may be positioned between the anode 504 and the light harvesting polymer layer 506a, 506n and may have a thickness of about 50 nm-250 nm. The electron transport layer 512 may be positioned between the cathode 508 and the light harvesting polymer layer 506a, 506n and may have a thickness of about 50 nm-250 nm. Etiher or both the hole transport layer 510 and electron transport layer 512 may contain carbon nanotubes. The hole transport layer 510 may be poly(ethylenedioxy)thiophene:poly(styrene sulphonic acid) ("PEDOT:PSS") or any other similar material. The incorporation of the hole transport layer 510 provides for a much smoother surface upon which to deposit the light harvesting polymer layer 506a, 506n. Additionally, the work function of PEDOT:PSS may match the valence band of the conducting polymer better than the anode 504 to facilitate hole conduction.

Following are several examples for exemplary purposes only and not intended to be limiting:

EXAMPLE 1

Synthesis of PFO- poly[2,7-(9,9-bis(3,6,9-trioxadecyl)fluorene)]

Synthesis of 1- Tosyloxy-3,6,9-trioxadecane

Triethlyene glycol monomethylether (10 g, 61 mmol) was dissolved in THF (50 mL) and cooled to approximately 0° C. in an ice bath. A solution of KOH (5.6 g, 100 mmol) in 10 mL water was slowly added to the mixture, and then a solution of TsCl (9.5 g, 50 mmol) in 20 mL THF was added drop-wise over 20 min. with vigorous stirring. After stirring overnight in an ice bath, the mixture was poured into distilled water (200 mL) and extracted with $CH_2Cl_2$ (2×100 mL). The combined organic solutions were washed with saturated $NaHCO_3$ solution (2×100 mL), distilled water (2×100 mL), dried over $MgSO_4$, and concentrated under reduced pressure to give 15.7 g as a clear colorless oil[9] in 99% yield. $^1$H NMR (300 MHz, $CDCl_3$), 2.3 (s, 3H), 3.22 (s, 3H), 3.28-3.70 (m, 10H), 4.04 (t, 2H), 7.24 (d, 2H), 7.68 (d, 2H).

Synthesis of 2,7-dibromo-9,9-bis(3,6,9-trioxadecyl)fluorene 2,7-dibromofluorene (5.0 g, 15.4 mmol) was dissolved in dried THF solution (30 mL). Sodium hydride (1.0 g, 40 mmol) was added to the THF solution at room temperature and refluxed for 5 hours. 1-Tosyloxy-3,6,9-trioxadecane (11.8 g, 37 mmol) in 20 mL of dry THF was added drop-wise to the refluxed solution. The mixture was allowed to refluxed over night, then cooled down, poured into distill water and extracted with chloroform (2×100 mL). The combined organic solutions were washed with saturated NaCl solution (2×100 mL), distilled water (1×100 mL), dried over $MgSO_4$, and concentrated under reduced pressure. Crude oil was further purified by column chromatography using hexane/ethyl acetate (50/50) as eluant. TLC (ethyl acetate/Hexane=1/1) $R_f$=0.12. The fraction at Rf=0.12 was collected and concentrated to give 5.7 product in 60% yield. $^1$H NMR (300 MHz, $CDCl_3$), 2.34(t, 4H), 2.77(t, 4H), 3.10-3.60(m, 22H), 7.40-7.60(m, 6H).

Synthesis of poly[2,7-(9,9-bis(3,6,9-trioxadecyl)fluorene)]

2,7-dibromo-9,9-bis(3,6,9-trioxadecyl)fluorene (4.0 g, 6.3 mmol), triphenylphosphine (164 mg, 0.63 mmol), zinc powder-100 mesh, 99.998% (1.3 g, 19 mmol), 2,2-dipyridyl (49 mg, 0.31 mmol) and nickel chloride (16 mg, 0.13 mmol) were charged in a 20 ml flask. Dry DMAC 3 ml was added via syringe and the mixture was stirred at 80 C for 3 days in a He glove box. After cooling, the polymer is poured in a 200 mL methanol/concentrated HCl (50/50) mixture. The mixture was precipitated in 500 mL of water, filtered, dried and redissolved in 100 mL of chloroform solution, washed with DI water (2×200 mL) and concentrated into 10 mL chloroform solution and precipitated in hexane (2×200 mL) to give 2.7 g final product in 68% yield. Mn 9,400; PDI 1.6 (GPC using polystyrene standard). $^1$H NMR (300 MHz, CDCl$_3$), 2.59 (b, 4H), 2.91 (b, 4H), 3.20-3.60(m, 22H), 7.50-8.00 (m, 6H). Elemental analysis calculations for C, 0.7101 and H, 0.0795 found C, 0.7084 and H 0.0800.

EXAMPLE 2

Preparation of a SWNT/PFO

The as-prepared (AP) grade SWNT tube was purchased from CarboLex® and used without further purification. The AP grade SWNT contains 60% of pure carbon nanotube and 40% of amorphous carbon and catalysts. The dispersion of SWNT is achieved by sonication of the mixture of SWNT, polymer and solution using a Branson 1210 sonicator. The solutions were then left without vibration for a week to sediment. The top part of the solutions was studied and used to cast films.

EXAMPLE 3

Preparation of an OLED with Carbon Nanotube in Light Emitting Layer

The resistance of the ITO glass used herein is 13 Ω/□. The ITO coated glass was successively cleaned in saturated KOH/Isopropanol solution, followed by three 20-minute sonication cleaning in acetone, isopropanol and methanol and final oxygen plasma treatment. The conductive polymers were spin coated in a class 100 clean room. The PEDOT/PSS aqueous solution was purchased from Aldrich and filtered through a 0.45 μm syringe filter. The PEDOT/PSS layer was spin coated at 1500 rpm, resulting in a 120 nm film. The conductive polymer solutions were filtered with 0.45 μm syringe filter. The generic composition to formulate SWNT/conductive polymer composite is 3.3 g AP grade SWNT/100 g conductive polymer/10 L solvent. (3.3 g of AP grade SWNT contains 2 g of pure SWNT). The PFO (or SWNT composite) layer was spin coated at 1000 rpm on the top of PEDOT/PSS layer, resulting in a 40 nm film. 50 nm of aluminum cathode was thermally evaporated onto the PFO film surface at a base pressure of 10$^{-6}$ torr. A shadow mask of 0.3 cm$^2$ area was used to define the cathode.

Comparative Example

Sample A: An OLED was constructed as in Example 3, except the carbon nanotube/polymer composite was used in the cathode. The Al deposition process was not necessary.

Sample B: An OLED was prepared as in Example 3, but without the carbon nanotube in the PFO layer. The results are discussed below.

Results:

SEM images were acquired using a JSM-6340F field emission SEM from JEOL instrument at 5 kV electron gun power. A Solartron™ 1286 electrochemical interface were used to measure the voltage-current dependence of the device.

Figure 6A:
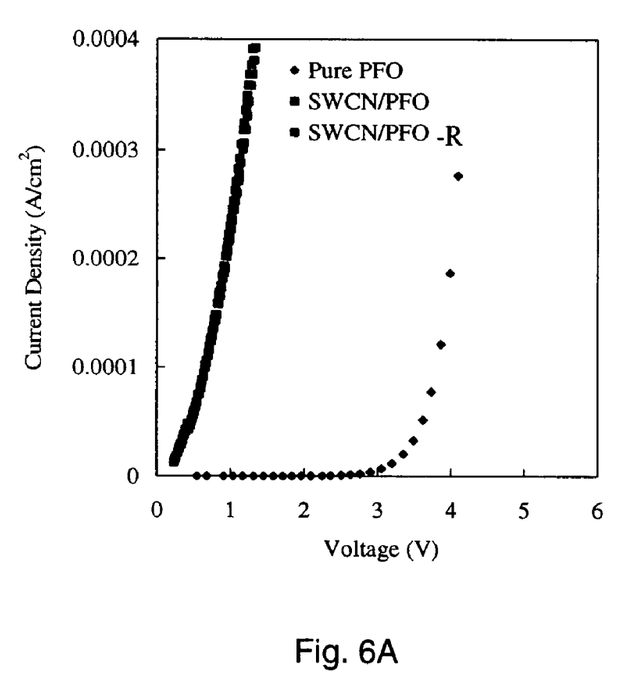
FIGS. 6A and 6B illustrate the current vs. voltage behavior of the composite devices at forward and reverse biases.
Figure 6B:
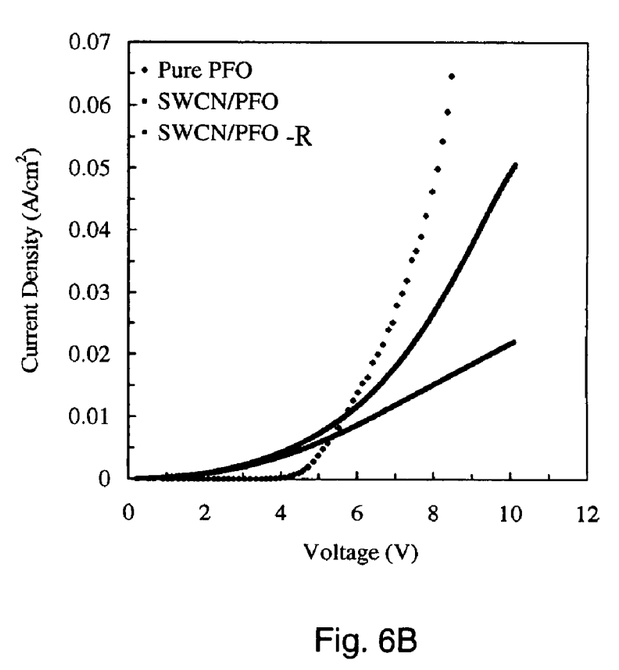

FIGS. 6A and 6B illustrate the current vs. voltage behavior of the composite devices at forward and reverse biases. The current vs. voltage behavior of the SWNT/PFO films was studied and compared to a device prepared with a pure PFO layer. The device configuration is ITO/PEDOT:PSS/PFO/SWNT (or pure PFO)/Al. Forward bias is defined as ITO positive and Al negative, whereas reverse bias is defined as ITO negative and Al positive. In either forward or reversed bias, the conductivity of PEDOT:PSS layer is an order of magnitude more than the PFO layer, so the current vs. voltage behavior of the device reflects the behavior of the PFO or PFO/SWNT layers. A PFO device with a configuration of ITO/PEDOT:PSS/PFO/Al was used for comparison. FIG. 6A shows the device behaviors at low current density. There is no rectification voltage at forward bias for the PFO/SWNT composite compared to the pure PFO film. The current densities of forward bias and reverse bias are identical for the composite device. The pure PFO device shows a turn-on voltage around 3 V at forward bias. There is very little leakage current below 3V for pure PFO devices. At reverse bias, the pure PFO device is not able to pass current due to the energy level mismatch between electrodes and molecular orbital of the PFO polymer. These indicate that the SWNT is the sole charge carrier in PFO/SWNT film at low current density below the turn-on voltage of the PFO polymer. At increasing current density as shown in FIG. 6B the forward and reverse bias currents are divergent around 5 V. Forward bias current density increases faster than the reverse bias. Light output was observed above 8.5 V for the PFO/SWNT composite device at forward bias but not under reverse bias at any voltage range. Therefore at high current density, the PFO also carries part of the charge at forward bias.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

REFERENCES

All references cited herein are hereby incorporated by reference in their entirety for all purposes.

1. TANG, C. W. ET AL., "Organic Electroluminescent Diodes," Applied Physics Letters, Vol. 51 (No. 12), p. 913-915, (Sep. 21, 1997); BURROUGHES, J. H. ET AL., "Light-Emitting Diodes Based on Conjugated Polymers," Nature, p. 539-541, (Oct. 11, 1990).
2. BRAUN, D. ET AL., "Visible Light Emission from Semiconducting Polymer Diodes," Applied Physics Lett., Vol. 58 (No. 18), p. 1982-1984, (May 6, 1991).
3. HEBNER, T. R. ET AL., "Inkjet Printing of Doped Polymers for Light Emitting Devices," Applied Physics Letters, Vol. 72 (No. 8), p. 519-521, (Feb. 2, 1998); PARDO, D. A. ET AL., "Application of Screen Printing in the Fabrication of Organic Light-Emitting Devices," Advanced Materials, Vol. 12 (No. 17), p. 1249-1252, (Sep. 1, 2000).
4. FOURNET, P. ET AL., "A Carbon Nanotube Composite as an Electron Transport Layer for M3EH-PPV Based Light-Emitting Diodes," Synthetic Metals, Elsevier, p. 1683-1684, (2001); WOO, H. S. ET AL., "Hole Blocking in Carbon Nanotube-Polymer Composite Organic Light-Emitting Diodes Based on Poly (m-phenylene vinylene-co-2, 5-dioctoxy-p-phenylene vinylene)," Applied Physics Letters, Vol. 77 (No. 9), p. 1393-1395, (Aug. 28, 2000); DALTON, A. B. ET AL., "A Functional Conjugated Poly- mer to Process, Purify and Selectively Interact with Single Wall Carbon Nanotubes," Synthetic Metals, Elsevier, p. 1217-1218, (2001).
5. Mc CARTHY, B. ET AL., "Microscopy Studies of Nanotube-Conjugated Polymer Interactions," Synthetic Metals, Elsevier, p. 1225-1226, (2001); FOURNET, P. ET AL., "A Carbon Nanotube Composite as an Electron Transport Layer for M3EH-PPV Based Light-Emitting Diodes," Synthetic Metals, Elsevier, p. 1683-1684, (2001).
6. O'CONNELL, M. J. ET AL, "Band Gap Fluorescence from Individual Single-Walled Carbon Nanotubes," Science, p. 593-596, (Jul. 26, 2002); XIA, H. S. ET AL., "Polymer-Encapsulated Carbon Nanotubes Prepared Through Ultrasonically Initiated In Situ Emulsion Polymerization," Chemistry of Materials, Vol. 15 (No. 20), p. 3879-3886, (Sep. 5, 2003); RICHARD, C. ET AL., "Supramolecular Self-Assembly of Lipid Derivatives on Carbon Nanotubes," Science, p. 775-777, (May 2, 2003).

What is claimed is:

1. A composition of matter, comprising:
a compound having the formula:

(X)n wherein X is selected from the group consisting of wherein $R_3$-$R_{15}$ is an oligoether group;
wherein said oligoether group terminates with a methyl group or hydroxyl group; and
wherein n is between 2 and 1000; and
a carbon nanotube;
wherein the carbon nanotube is grasped by the oligoether groups or alkyl chains of the compound and the composition of matter is transparent; wherein said oligoether group is selected from the group consisting of methyleneoxide, ethyleneoxide, trimethyleneoxide, methyltriethyleneoxide and tetramethyleneoxide.

2. The composition of claim 1 wherein $R_3$-$R_{15}$ each further comprise methyltriethyleneoxide.

3. A thin film device, comprising:
an anode;
a cathode; and
at least one light emitting layer or light harvesting layer between the anode and cathode, the at least one light emitting layer or light harvesting layer having at least one carbon nanotube and an amphiphilic conductive polymer;
wherein the carbon nanotube is grasped by the amphiphilic conductive polymer and the light emitting layer or light harvesting layer is transparent, and wherein the amphiphilic conductive polymer has the following structure:

(X)n wherein X is selected from the group consisting of wherein $R_3$-$R_{15}$ is an oligoether group;
wherein said oligoether group terminates with a methyl group or hydroxyl group; and wherein n is between 2 and 1000; wherein said oligoether group is selected from the group consisting of methyleneoxide, ethyleneoxide, trimethyleneoxide, methyltriethyleneoxide and tetramethyleneoxide.

4. The device of claim 3 wherein $R_3$-$R_{15}$ each further comprise methyltriethyleneoxide.

5. The device of claim 3 wherein the device comprises a light harvesting layer and is a photovoltaic device capable of generating electricity in response to electromagnetic stimulation.

6. The device of claim 3 further comprising a hole transport layer between the anode and the at least one light emitting layer or light harvesting layer.

7. The device of claim 3 further comprising an electron transport layer between the anode and the at least one light emitting layer or light harvesting layer.

8. A thin film device, comprising:
an anode;
a cathode; and
at least one light emitting layer between the anode and cathode having at least one carbon nanotube and an amphiphilic conductive polymer;
wherein the carbon nanotube is grasped by the amphiphilic conductive polymer and the light emitting layer is transparent, and wherein the amphiphilic conductive polymer has the following structure:

(X)n wherein X is selected from the group consisting of

,  , wherein $R_3$-$R_{15}$ are selected from the group consisting of an oilgoether group, an alkyl chain having a tetraamine and an associated counter ion, and an alkyl chain having an $SO_3$ group and an associated counter ion;
wherein said oligoether group terminates with a methyl group or hydroxyl group; and wherein n is between 2 and 1000; wherein the device is an organic light-emitting device.

9. The device of claim 8 wherein the anode further comprises at least one carbon nanotube.

10. The device of claim 8 wherein the cathode further comprises at least one carbon nanotube.

11. A thin film device, comprising:
an anode having at least one carbon nanotube;
a cathode having at least one carbon nanotube; and
at least one light emitting layer or light harvesting layer between the anode and cathode, the at least one light emitting layer or light harvesting layer having at least one carbon nanotube and an amphiphilic conductive polymer;
wherein the carbon nanotube is grasped by the amphiphilic conductive polymer and the light emitting layer or light harvesting layer is transparent, wherein the amphiphilic conductive polymer has the following structure:

(X)n wherein X is selected from the group consisting of wherein $R_3$-$R_{15}$ is an oligoether group, wherein said oligoether group terminates with a methyl group or hydroxyl group; and wherein n is between 2 and 1000 wherein said oligoether group is selected from the group consisting of methyleneoxide, ethyleneoxide, trimethyleneoxide, methvitriethvieneoxide and tetramethyleneoxide.

12. The device of claim 11 further comprising a hole transport layer between the anode and the at least one light emitting layer or light harvesting layer.

13. The device of claim 11 further comprising an electron transport layer between the anode and the at least one light emitting layer or light harvesting layer.

* * * * *